(12) United States Patent
Huang et al.

(10) Patent No.: US 9,691,708 B1
(45) Date of Patent: Jun. 27, 2017

(54) SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Yu-Chih Huang, Hsinchu (TW); Chih-Hua Chen, Hsinchu County (TW); Chih-Wei Lin, Hsinchu County (TW); Hao-Yi Tsai, Hsinchu (TW); Yu-Feng Chen, Hsinchu (TW); Yu-Jen Cheng, New Taipei (TW); Chih-Hsuan Tai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/214,475

(22) Filed: Jul. 20, 2016

(51) Int. Cl.
*H01L 23/538* (2006.01)
*H01L 23/31* (2006.01)
(Continued)

(52) U.S. Cl.
CPC ........ *H01L 23/5389* (2013.01); *G06K 9/0002* (2013.01); *H01L 21/486* (2013.01); *H01L 21/4853* (2013.01); *H01L 21/4857* (2013.01); *H01L 21/565* (2013.01); *H01L 23/3114* (2013.01); *H01L 23/5383* (2013.01);
(Continued)

(58) Field of Classification Search
CPC ....... H01L 23/12; H01L 23/14; H01L 23/142; H01L 23/31; H01L 23/3157; H01L 23/3171; H01L 23/481; H01L 23/522; H01L 23/5226; H01L 23/538; H01L 23/5383; H01L 23/5384; H01L 23/5385; H01L 23/5389; H01L 24/02; H01L 24/10; H01L 2224/023; H01L 2224/0233; H01L 2224/02331; H01L 2224/0237; H01L 2224/02372; H01L 2224/02371; H01L 2224/0401; H01L 2224/80
See application file for complete search history.

(56) References Cited

U.S. PATENT DOCUMENTS

8,361,842 B2   1/2013   Yu et al.
8,680,647 B2   3/2014   Yu et al.
(Continued)

*Primary Examiner* — Scott B Geyer
(74) *Attorney, Agent, or Firm* — Jianq Chyun IP Office (57) ABSTRACT

A semiconductor package and a manufacturing method for the semiconductor package are provided. The semiconductor package includes a molded semiconductor device, a first redistribution layer, a second redistribution layer, and a plurality of through interlayer vias. The molded semiconductor device includes a die. The first redistribution layer is disposed on a first side of the molded semiconductor device. The second redistribution layer is disposed on a second side of the molded semiconductor device opposite to the first side, wherein the second redistribution layer includes a patterned metal layer having an interconnection circuit portion electrically connected to the die and a metal ring surrounding and insulated from the interconnection circuit portion. The through interlayer vias are located right under the metal ring and extending through the molded semiconductor device to be electrically connect the first redistribution layer and the second redistribution layer.

20 Claims, 6 Drawing Sheets

(51) Int. Cl.
*H01L 21/48* (2006.01)
*H01L 21/56* (2006.01)
*H01L 23/58* (2006.01)
*H01L 23/00* (2006.01)
*G06K 9/00* (2006.01)

(52) U.S. Cl.
CPC ...... *H01L 23/5384* (2013.01); *H01L 23/5386* (2013.01); *H01L 23/562* (2013.01); *H01L 23/564* (2013.01); *H01L 23/585* (2013.01)

(56) References Cited

U.S. PATENT DOCUMENTS

| | | | |
|---|---|---|---|
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,129,873 B2 * | 9/2015 | Kim | H01L 27/14618 |
| 9,281,297 B2 * | 3/2016 | Lin | H01L 21/565 |
| 2011/0291288 A1 | 12/2011 | Wu et al. | |
| 2012/0256280 A1 * | 10/2012 | Erhart | H01L 21/561 |
| | | | 257/414 |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0264684 A1 | 10/2013 | Yu et al. | |
| 2013/0307140 A1 | 11/2013 | Huang et al. | |
| 2014/0138788 A1 * | 5/2014 | Kim | H01L 27/14618 |
| | | | 257/433 |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0221601 A1 * | 8/2015 | Kim | H01L 24/02 |
| | | | 257/782 |
| 2015/0235071 A1 * | 8/2015 | Chang | G06K 9/00033 |
| | | | 382/124 |
| 2015/0287708 A1 * | 10/2015 | Lin | H01L 21/6836 |
| | | | 438/109 |
| 2016/0212852 A1 * | 7/2016 | Hu | H01L 23/5389 |
| 2016/0343634 A1 * | 11/2016 | Erhart | H01L 21/561 |
| 2017/0018590 A1 * | 1/2017 | Yiu | H01L 27/14634 |

* cited by examiner

SEMICONDUCTOR PACKAGE AND MANUFACTURING METHOD THEREOF

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A to FIG. 5F are schematic cross sectional views of various stages in the manufacturing process of the semiconductor package of FIG. 1.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Figure 1:
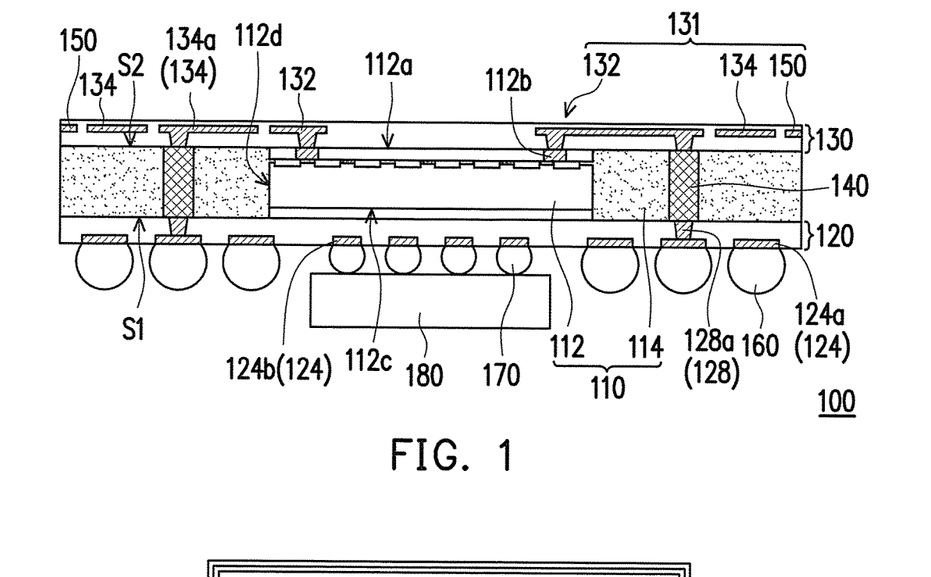
FIG. 1 is a schematic cross sectional view illustrating a semiconductor package according to some exemplary embodiments of the present disclosure.
Figure 2:
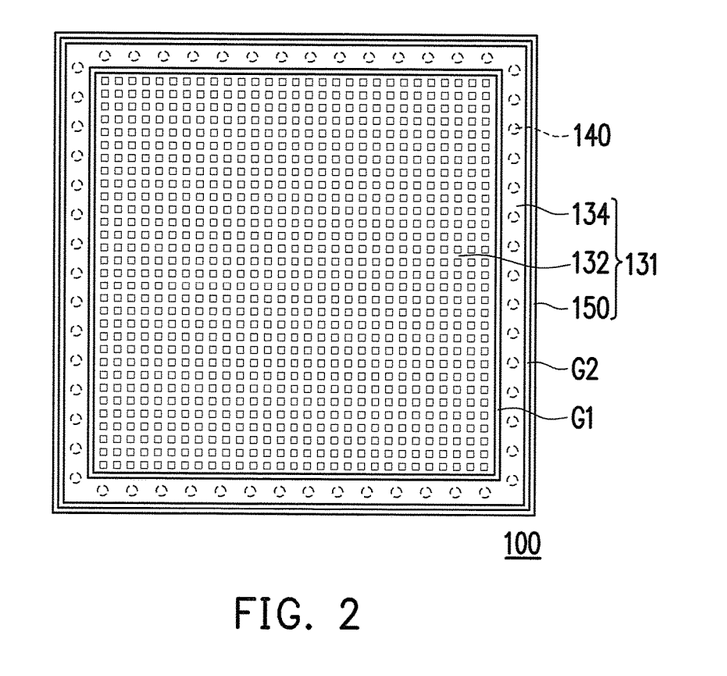
FIG. 2 is a schematic top view illustrating of the semiconductor package in FIG. 1.
Figure 3:
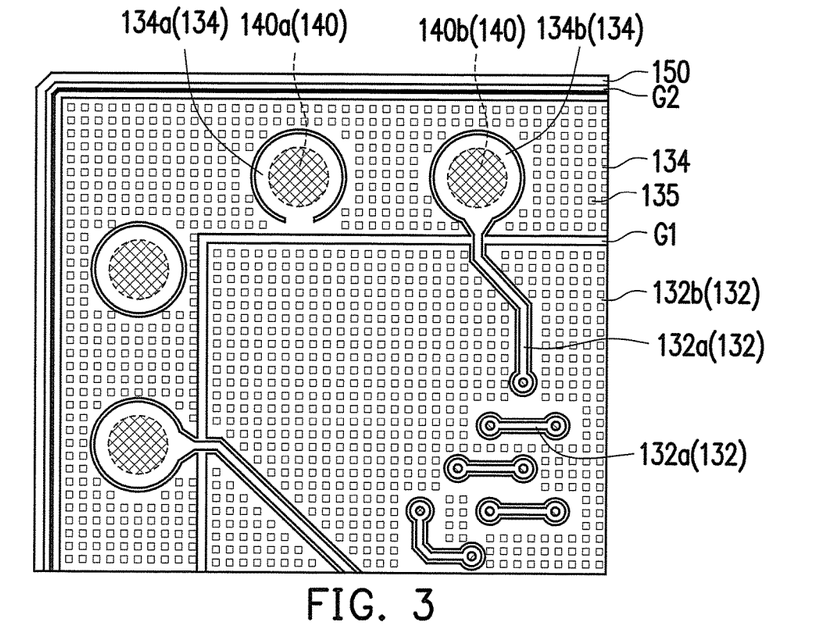
FIG. 3 is a schematic partial enlarge view of the semiconductor package in FIG. 2.

FIG. 1 is a schematic cross sectional view illustrating a semiconductor package according to some exemplary embodiments of the present disclosure. FIG. 2 is a schematic top view illustrating of the semiconductor package in FIG. 1. FIG. 3 is a schematic partial enlarge view of the semiconductor package in FIG. 2. Referring to FIG. 1, in exemplary embodiments, a semiconductor package 100 includes a molded semiconductor device 110, a first redistribution layer 120, a second redistribution layer 130 and a plurality of through interlayer vias 140. The molded semiconductor device 110 includes a first die 112 and a molding compound 114. In some embodiments, the first die 112 includes an active surface 112a having a plurality of electrical terminals 112b and a back surface 112c opposite to the active surface 112a. In certain embodiments, the first die 112 is molded in the molding compound 114 and the molding compound 114 at least encapsulates side surfaces 112d of the first die 112. In some embodiments, the first redistribution layer 120 is disposed on a first side S1 of the molded semiconductor device 110, the second redistribution layer 130 is disposed on a second side S2 of the molded semiconductor device 110, and the second side S2 is opposite to the first side S1. Namely, the first die 112 is sandwiched between the first redistribution layer 120 and the second redistribution layers 130. In other words, the first die 112 and the molding compound 114 are disposed on the first redistribution layer 120, and the second redistribution layer 130 is disposed on the first die 112 and the molding compound 114. In some embodiments, the first redistribution layer 120 or the second redistribution layers 130 may include one or more patterned metal layers and one or more polymer-based dielectric layers. The material of the polymer dielectric material layers includes polymide, benzocyclobutene (BCB), polybenzooxazole (PBO), or any other suitable polymer-based dielectric material, for example. As shown in FIG. 2 and FIG. 3, in certain embodiments, the second redistribution layer 130 includes at least a patterned metal layer 131, which includes an interconnection circuit portion 132, a metal ring 134 and optionally a seal ring 150.

In some embodiments, the active surface 112a of the first die 112 faces away from the first redistribution layer 120 (i.e. the first die 112 is facing up as shown in FIG. 1), and the back surface 112c of the first die 112 contacts the first redistribution layer 120. The first die 112 is not contacted with the through interlayer vias 140. In some embodiments, the through interlayer vias 140 extending through the molded semiconductor device 110 electrically connect the first redistribution layer 120 and the second redistribution layer 130. To be more specific, both ends of the through interlayer vias 140 exposed from the molding compound 114 of the molded semiconductor device 110 are electrically connected to the first redistribution layer 120 and the second redistribution layer 130.

In some embodiments, the through interlayer vias 140 are formed on exposed plugs 128a of the first redistribution layer 120, and the through interlayer vias 140 are directly connected to the plugs 128a of the first redistribution layer 120. In some embodiments, the through interlayer vias 140 are through integrated fan-out (InFO) vias. In certain embodiments, the locations of the plugs 128a of the first redistribution layer 120 are substantially aligned with or at least overlapped with the locations of the through interlayer vias 140. In some embodiment, as the through interlayer vias 140 are directly connected to the plugs 128a of the first redistribution layer 120, shorter electrical connection path is established for the dies, thus reducing the height of the semiconductor package 100 and improving electrical performance of the semiconductor package 100. In some embodiments, the through interlayer vias 140 may be formed by forming a mask pattern (not shown) with openings exposing the plugs 128a of the first redistribution layer 120, forming a metallic material filling the openings to form the through interlayer vias 140 by electroplating or deposition and then removing the mask pattern. In certain embodiments, the through interlayer vias 140 are formed on the first redistribution layer 120 and are arranged aside the first die 112 and along the periphery of the first die 112 so as to not to hinder the sensing region of the first die 112. Depending on product design, the through interlayer vias 140 may be arranged at locations between the dies.

In some embodiments, the first die 112 and the through interlayer vias 140 on the first redistribution layer 120 are molded in the molding compound 114. In some embodiments, the molding compound 114 fills the gaps between the first die 112 and the through interlayer vias 140 and covers the first redistribution layer 120. In some embodiments, the molding compound 114 is formed over the first die 112 and covers the active surface 112a of the first die 112. In some embodiments, the molding compound 114 encapsulates at least the side surfaces 112d of the first die 112 and exposes the active surface 112a of the first die 112 as shown in FIG. 1. The molding compound 114 includes, for example, an epoxy resin, or any other suitable type of molding material. In certain embodiments, the through interlayer vias 140 may further includes barrier layers (not shown) located between the through interlayer vias 140 and the molding compound 114.

In some embodiments, the semiconductor package 100 may further include one or more electrical connectors 160, 170 located on the contact pads 124a, 124b of the topmost patterned metal layer 124 of the first redistribution layer 120. The number and the arrangement of the electrical connectors 160, 170 may be adjusted according to layout or routing requirements. In some embodiments, the electrical connectors 160 are, for example, solder balls or ball grid array (BGA) balls placed on the contact pads 124a, 124b exposed by the topmost dielectric layer 122 of the first redistribution layer 120 and the contact pads 124a under the electrical connectors 160 function as ball pads. In some embodiments, the electrical connectors 170 are, for example, bumps for electrically connecting another die 180, and the die 180 may further include another electronic device such as integrated passive devices.

In alternative embodiments, the semiconductor package 100 may further include additional dies disposed over the first die 112 and/or aside the first die 112, and the interconnect structure may be adjusted to electrically connect the additional dies. The structure of the present disclosure is not limited to include only the first die 112 and the second die 180.

Referring to FIG. 1, FIG. 2 and FIG. 3, in some embodiments, the interconnection circuit portion 132 of the second redistribution layer 130 is electrically connected to the electrical terminals 112b of the first die 112 as shown in FIG. 1. In some embodiments, the metal ring 134 surrounds the interconnection circuit portion 132 and is electrically insulated from the interconnection circuit portion 132, while the seal ring 150 surrounds the metal ring 134 and the interconnection circuit portion 132 and is electrically insulated from the metal ring 134 and the interconnection circuit portion 132. In detail, in certain embodiments, the seal ring 150 and the metal ring 134 extend at the same level as the interconnection circuit portion 132 since the seal ring 150, the metal ring 134 and the interconnection circuit portion 132 are fabricated from the same metal layer and are a part of the patterned metal layer 131. To be more specific, in one embodiment, the patterned metal layer 131 further includes a groove G1 surrounding the interconnection circuit portion 132 to define the interconnection circuit portion 132 and the metal ring 134, and separate the metal ring 134 from the interconnection circuit portion 132. In one embodiment, the patterned metal layer 131 further includes a groove G2 surrounding the metal ring 134 to define the metal ring 134 and the seal ring and isolate the metal ring 134 from the seal ring 150. The through interlayer vias 140 are located right under the metal ring 134, which enhances the space utilization and reduces the size of the semiconductor package 100.

In one embodiment, the patterned metal layer 131 further includes at least one first pad portion 134a and at least one second pad portion 134b located in the span region of the metal ring 134. In some embodiments, the first pad portion 134a is joined with the metal ring 134 and the second pad portion 134b is isolated from the metal ring 134. In some embodiments, at least one of the through interlayer vias 140 (e.g., the through interlayer via 140a shown in FIG. 3) is connected to the first pad portion 134a of the metal ring 134 and is electrically connected to the metal ring 134. Accordingly, at least another one of the through interlayer vias 140 (e.g., the through interlayer via 140b shown in FIG. 3) is connected to the second pad portion 134b and is electrically connected to the interconnection circuit portion 132. In certain embodiments, the metal ring 134 is formed in a metal mesh form, which means the metal ring 134 may include a plurality of openings 135 as shown in FIG. 3. Similarly, in some embodiments, the interconnection circuit portion 132 includes a plurality of interconnection lines 132a and a metal mesh pattern 132b insulated from the interconnection lines 132a. In one embodiment, at least one interconnection line 132a is connected with the second pad portion 134b so that the through interlayer via 140b is electrically connected to the interconnection circuit portion 132 via the interconnection line 132a and the second pad portion 134b. The metal mesh of the metal ring 134 and the metal mesh pattern 132b function as dummy mesh and are configured to reduce the stress on the interconnection circuit portion 132 and the metal ring 134, so as to prevent the interconnection circuit portion 132 and the metal ring 134 from warpage.

Figure 4:
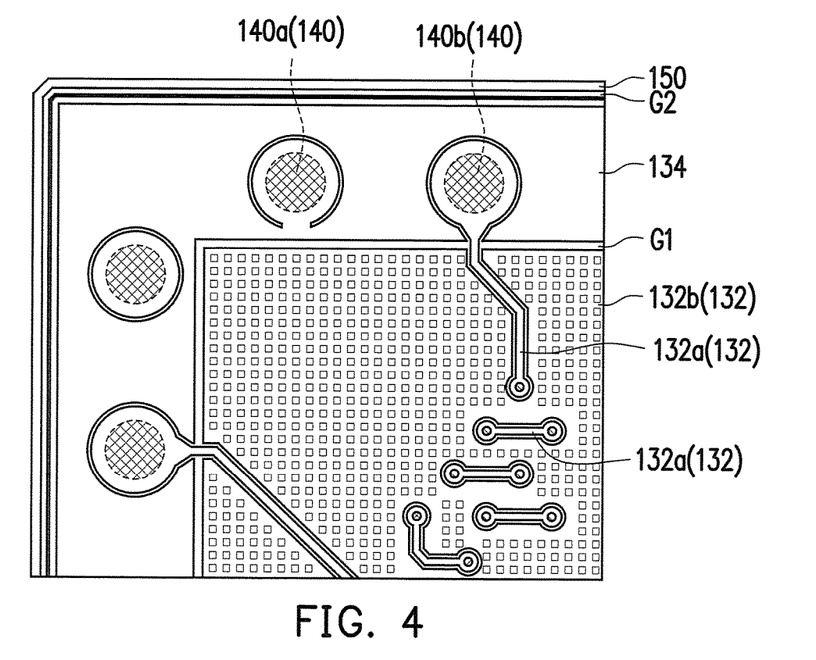
FIG. 4 is a schematic partial enlarge view of a semiconductor package according to some exemplary embodiments of the present disclosure.

FIG. 4 is a schematic partial enlarge view of a semiconductor package according to some exemplary embodiments of the present disclosure. In alternative embodiments, the metal ring 134 may be shaped as a solid metal ring as shown in FIG. 4 without the openings illustrated in FIG. 3. The disclosure does not limit the formation of the metal ring 134 as long as it surrounds and insulated from the interconnection circuit portion 132. In some embodiments, the first die 112 may be a sensor chip including one or more sensor devices. In certain embodiments, the first die 112 includes at least one fingerprint sensor such as an optical fingerprint sensor or a capacitance fingerprint sensor, or other suitable type of sensors. In some embodiments, the first die 112 is a sensor chip and the second redistribution layer 130 is the front-side redistribution layer as the first die 112 may detect or sense light or signal. However, the first die 112 may be other types of dies or chips with different functions to match with the product design. In certain embodiments, the first die 112 includes a fingerprint sensor and the metal ring 134 is configured to function as a driving ring for a capacitive touch switch, which turns the sensor on and off when a finger is present.

In some embodiments, the seal ring 150 that is optionally formed on the molding compound 114 of the molded semiconductor device 110 surrounds the metal ring 134, and is configured to stop undesirable moisture and mobile ionic contaminants from penetrating through the second redistribution layer 130 and through the side surfaces of the semiconductor package 100 into a functional circuit area of the first die 112. Moreover, the seal ring 150 can enable structural reinforcement of the semiconductor package 100, thereby preventing operational reliability of the first die 112 from being degraded.

FIG. 5A to FIG. 5F are schematic cross sectional views of various stages in the manufacturing process of the semiconductor package of FIG. 1. The same elements described in FIG. 1 to FIG. 3 will use the same reference numbers, and certain details or descriptions of the same elements will not be repeated herein. In exemplary embodiments, the semiconductor manufacturing process may be part of a wafer level packaging process. In some embodiments, one die is shown to represent plural dies of the wafer, and one single package is shown to represent plural semiconductor packages obtained following the semiconductor manufacturing process.

Figure 5A:
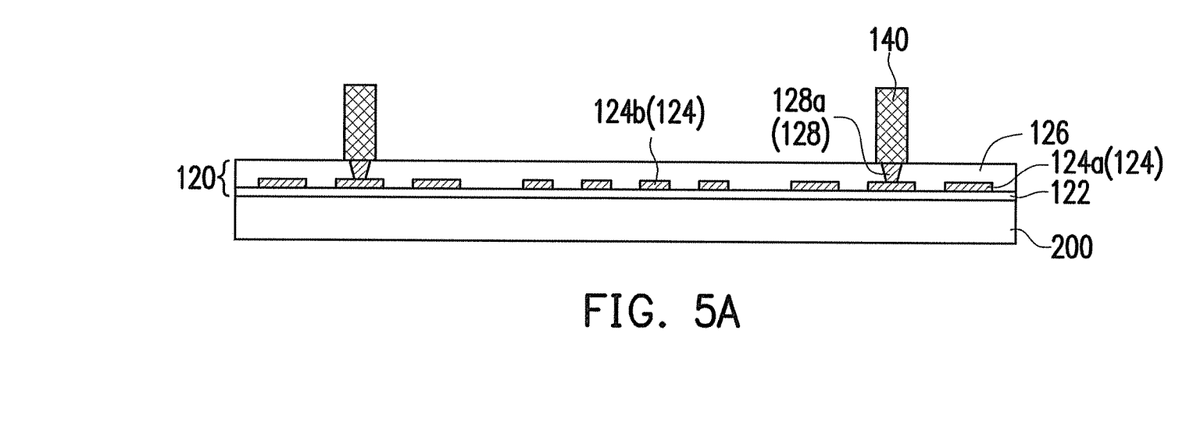

Referring to FIG. 5A, in some embodiments, a carrier 200 is provided. The carrier 200 may be a glass carrier or any suitable carrier for the manufacturing process of the semiconductor package 100. In some embodiments, the carrier 200 is coated with a debond layer. The material of the debond layer may be any material suitable for debonding the carrier 200 from the above layers disposed thereon. Next, a first redistribution layer 120 is formed on the carrier 200. In certain embodiments, the steps of forming the first redistribution layer 120 include forming a dielectric layer 122 on the carrier 200 and forming and patterning a metal layer (not shown) over the dielectric layer 122 to form the patterned metal layer 124. In certain embodiments, the patterned metal layer 124 includes one or more contact pads 124a, 124b. In certain embodiments, the patterned metal layer 124 may be formed by electroplating or deposition. In certain embodiments, the formation of the first redistribution layer 120 further includes forming a dielectric layer 126 on the patterned metal layer 124 and the dielectric layer 122, patterning the dielectric layer 126 to expose the patterned metal layer 124 and forming a patterned metal layer 128 connected to the exposed patterned metal layer 124.

In certain embodiments, the first redistribution layer 120 is formed by stacking the dielectric layers 122, 126 and the patterned metal layer 124, 128 in a layer-by-layer manner. That is to say, in some embodiments, the first redistribution layer 120 may include more or less than the two dielectric layers 124, 126 and also may include more or less than the two patterned metal layers 124, 128 shown in FIG. 5A. The number of patterned metal layers and the number of dielectric layers are adjusted depending on the routing requirement of the respective semiconductor package 100. In some embodiments, a plurality of through interlayer vias 140 is formed on the first redistribution layer 120 and electrically connected to the first redistribution layer 120. Specifically, in some embodiments, the through interlayer vias 140 are formed on the dielectric layer 126 and connected to the plugs 128a of the patterned metal layer 128. In some embodiments, the through interlayer vias 140 are formed by electroplating, deposition or any other suitable method.

Figure 5B:
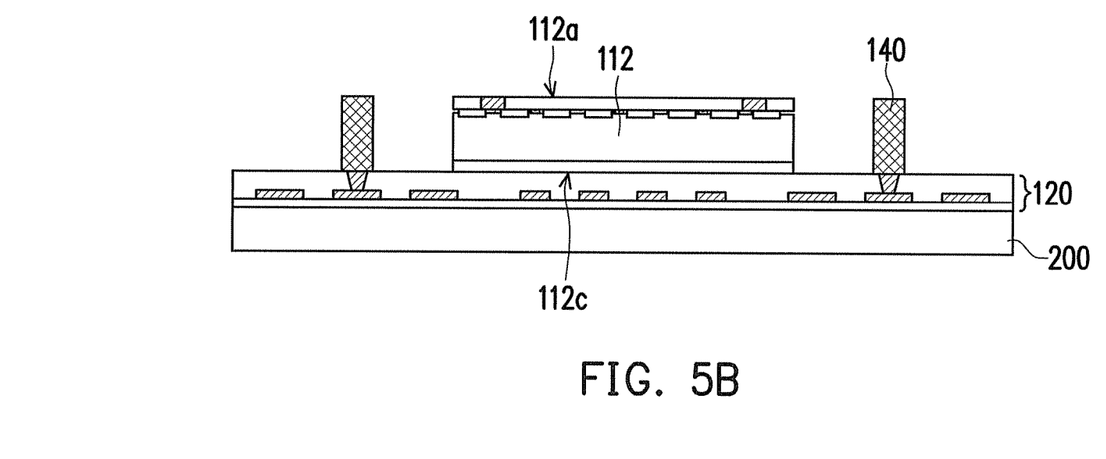

Referring to FIG. 5B, in some embodiments, at least one first die 112 is disposed on the first redistribution layer 120. In exemplary embodiments, the first die 112 is a sensor chip including one or more sensor devices. In certain embodiments, the first die 112 includes at least one fingerprint sensor such as an optical fingerprint sensor or a capacitance fingerprint sensor, or other suitable type of sensors including charge-coupled devices (CCDs). In some embodiments, the first die 112 is disposed on the first redistribution layer 120 such that the active surface 112a of the first die 112 faces away from the first redistribution layer 120 (i.e. facing up). As shown in FIG. 5B, the first die 112 is disposed on the dielectric layer 126 and the back surface 112c of the first die 112 is in contact with the dielectric layer 126 of the first redistribution layer 120. In one embodiment, a die attach film (not shown) is provided between the first die 112 and the first redistribution layer 120. The through interlayer vias 140 are arrange aside and around the first die 112 and the first die 112 is arranged away from the through interlayer vias 140.

Figure 5C:
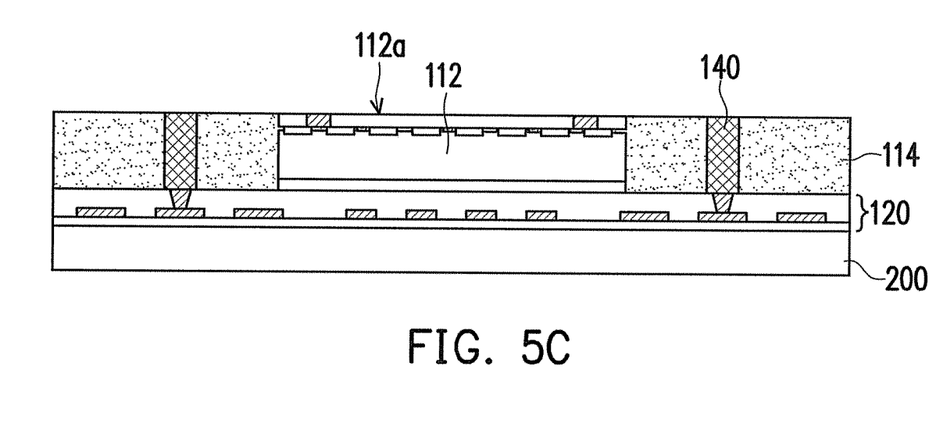

Referring to FIG. 5C, in some embodiments, a molding compound 114 is formed on the first redistribution layer 120 and encapsulates the first die and the through interlayer vias. In other words, the first die 112 and the through interlayer vias 140 on the first redistribution layer 120 are molded in the molding compound 114. In some embodiments, the molding compound 114 fills the gaps between the first die 112 and the through interlayer vias 140, and covers the first redistribution layer 120. In some embodiments, the molding compound 114 is formed over the first die 112 and covers the active surface 112a of the first die 112.

In some embodiments, the molding compound 114 is planarized to expose the through interlayer vias 140. In some embodiment, the over-molded molding compound 114 and the through interlayer vias 140 are polished until the electrical terminals 112b of the first die 112 are exposed. In one embodiment, top surfaces of the through interlayer vias 140, the molding compound 114, and the first die 112 after processed become substantially coplanar. In some embodiments, the molding compound 114 and/or the through interlayer vias 140 are planarized through a grinding process or a chemical mechanical polishing (CMP) process. After the grinding process, a cleaning step may be optionally performed, for example, to clean and remove the residue generated from the grinding step. However, the disclosure is not limited thereto, and the planarizing step may be performed through any other suitable method.

Figure 5D:
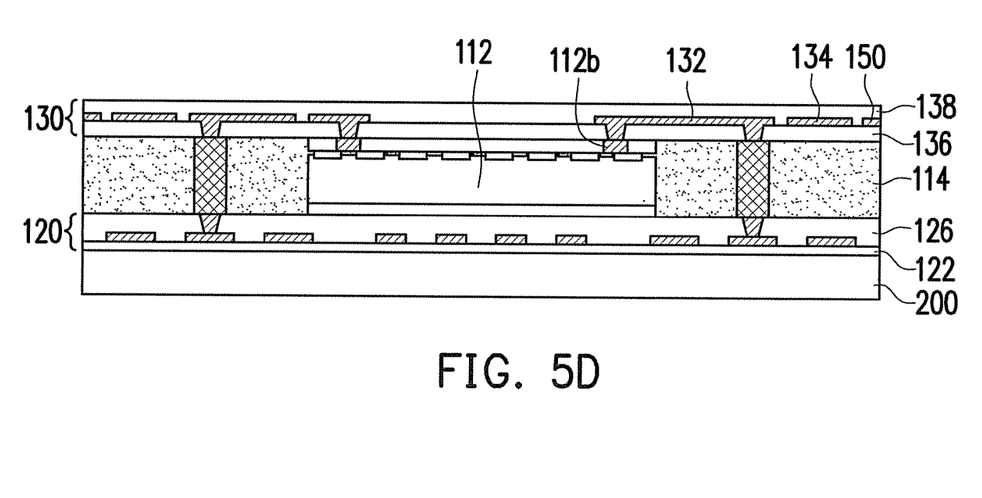

Referring to FIG. 5D, the second redistribution layer 130 is formed on the molding compound 114 and over the first die 112. In some embodiment, the second redistribution layer 130 is electrically connected to the through interlayer vias 140 and the first die 112. The through interlayer vias 140 are located right under the metal ring 134 and arranged within the span (span region) of the metal ring 134, so as to enhance the space utilization and reduce the size of the semiconductor package 100. The formation of the second redistribution layer 130 includes sequentially forming a patterned first dielectric layer 136, the patterned metal layer 131, and a second dielectric layer 138 layer by layer. The methods of forming the second redistribution layer 130 are similar to the methods of forming the first redistribution layer 120.

In certain embodiments, the first dielectric layer is firstly formed on the molding compound 114 and the first die 112, and then is patterned to form the patterned first dielectric layer 136 with a plurality of openings as shown in FIG. 5D. The openings expose the through interlayer vias 140 and a plurality of electrical terminals 112b of the first die 112. In some embodiments, a metal layer is formed on the patterned first dielectric layer 136 and fills the openings. Then, the metal layer is patterned to form the patterned metal layer 131 including the interconnection circuit portion 132 and the driving ring 134 as shown in FIG. 3. In some embodiments, the interconnection circuit portion 132 is electrically connected to the through interlayer vias 140 and is electrically connected to the electrical terminals 112b of the first die 112. Referring to FIG. 3, in some embodiments, the metal ring 134 surrounds the interconnection circuit portion 132 and is insulated from the interconnection circuit portion 132. In certain embodiments, the metal ring 134 extends at the same level as the interconnection circuit portion 132 since the interconnection circuit portion 132 and the metal ring 134 are fabricated from the same metal layer by one patterning process. In one embodiment, the metal layer is patterned to form a groove G1 surrounding the interconnection circuit portion 132 to define the interconnection circuit portion 132 and the metal ring 134 and isolated the metal ring 134 from the interconnection circuit portion 132. In some embodiments, a second dielectric layer 138 is subsequently formed to cover the patterned first dielectric layer 136 and the patterned metal layer 131.

In certain embodiments, the second redistribution layer 130 may include more or less than the two dielectric layers 136, 138 and more or less than one patterned metal layer 131. In some embodiments, as the interconnection circuit portion 132 and the metal ring 134 are patterned from the same metal layer (patterned metal layer 131), the interconnection circuit portion 132 and the metal ring 134 are located at the same level in the second redistribution layer 130. Namely, the number of patterned metal layers and the number of dielectric layers may be adjusted depending on the routing requirement of the semiconductor package 100. In some embodiments, the metal ring 134 is in a metal mesh form, which means the metal ring 134 may include a plurality of openings 135 as shown in FIG. 3. In some embodiments, the interconnection circuit portion 132 may include a plurality of interconnection lines 132a and a metal mesh pattern 132b insulated from the interconnection lines 132a. The metal mesh of the metal ring 134 and the metal mesh pattern 132b functions as dummy mesh and is configured to reduce the stress on the interconnection circuit portion 132 and the metal ring 134, so as to prevent the interconnection circuit portion 132 and the metal ring 134 from warpage.

Figure 6:
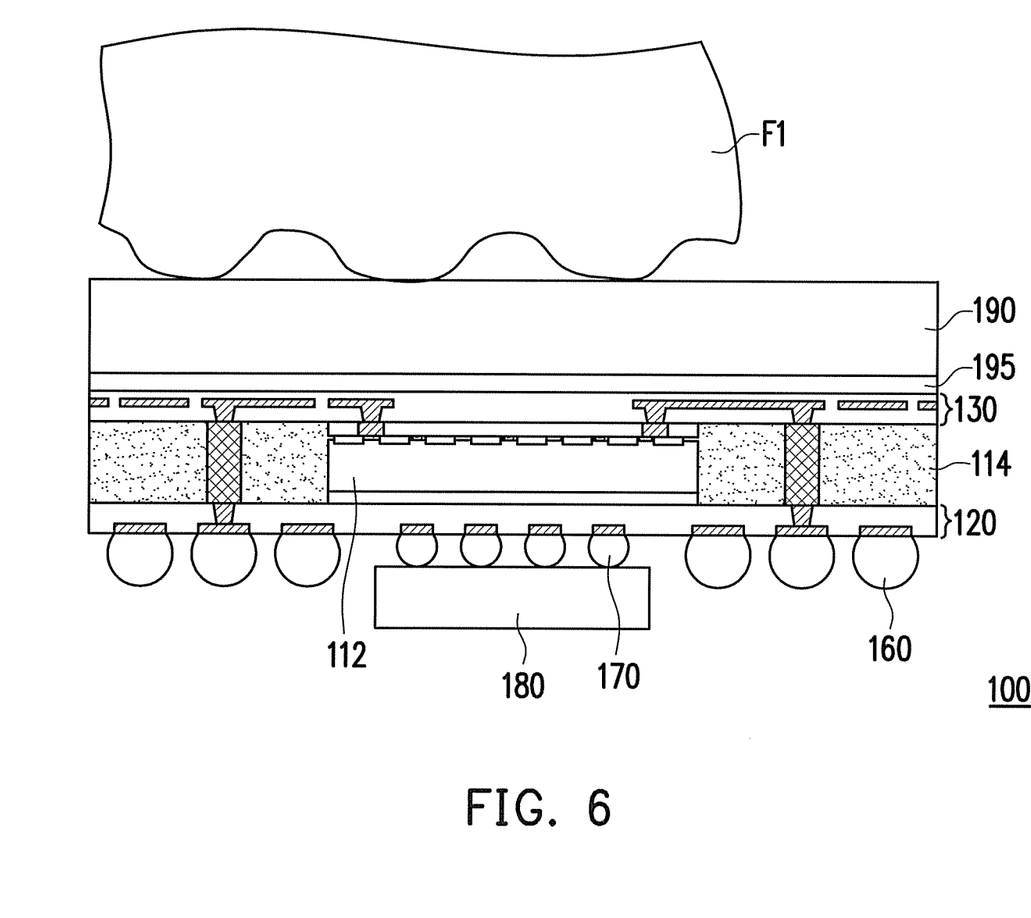
FIG. 6 is a schematic cross sectional view illustrating a semiconductor package according to some exemplary embodiments of the present disclosure.

FIG. 6 is a schematic cross sectional view illustrating a semiconductor package according to some exemplary embodiments of the present disclosure. Referring to FIG. 5D and FIG. 6, in some embodiments, a protection layer 190 as shown in FIG. 6 may be disposed on the second redistribution layer 130, and the protection layer 190 contacts the second dielectric layer 138. In some embodiments, the protection layer 190 includes, for example, a glass cover, a cover plate, a hard coating layer, or any other suitable protective films. In some embodiments, the protection layer 190 further includes a functional layer, such as a polarizing film, a color film, an anti-reflection layer or an anti-glare layer. In certain embodiments, the protection layer 190 at least allows specific signal or light at certain wavelengths to pass through. A suitable protection layer 110 is selected based on the design and the requirements of the products. In some embodiments, the adhesive layer 195 as shown in FIG. 6 may be firstly applied onto the second redistribution layer 130 or to the protection layer 190, and then the protection layer 190 is disposed on the second redistribution layer 130 to be adhered to the second redistribution layer 130. The adhesive layer 195 includes, for example, an ultra-violet (UV) curable adhesive, a heat curable adhesive, an optical clear adhesive or a light-to-heat conversion (LTHC) adhesive, or the like, although other types of adhesives may be used. In addition, the adhesive layer 195 is also adapted to allow light or signal to pass through. In certain embodiment, the first die 112 includes at least a fingerprint sensor and the metal ring 134 is configured to function as a driving ring for a capacitive touch switch, which turns the sensor on and off when a finger F1 touches the protection layer 190. As such, the first die 130 is able to receive and detect signal passing through the protection layer 190.

Figure 5E:
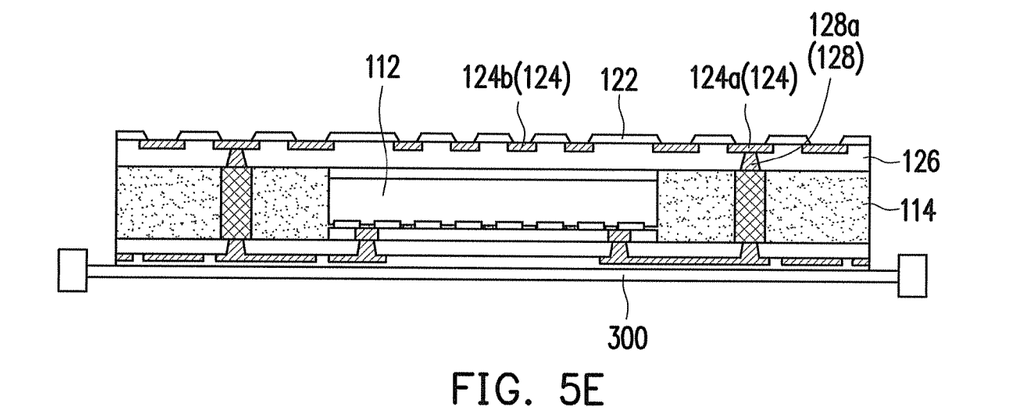

Referring to FIG. 5E, in some embodiments, the carrier 200 is debonded from the first redistribution layer 120. In some embodiments, the package structure 100 debonded from the carrier 200 is then flipped (turned upside down) and is disposed on a fixture 300. In some embodiments, the fixture 300 is, for example, a carrier tape, but the fixture 300 may also be another suitable type of carrier for carrying the package structure 100 debonded from the carrier 200. As seen in FIG. 5E, the remaining structure debonded from the carrier 200 is flipped so that the surface of the first redistribution layer 120 faces upwards becomes the top surface, and the patterned metal layer 124 becomes the topmost patterned metal layer. Then, the dielectric layer 122 is patterned to form a plurality of openings on the dielectric layer 122 of the first redistribution layer 120, and the contact pads 124a of the topmost patterned metal layer 124 are exposed by the openings of the dielectric layer 122.

Figure 5F:
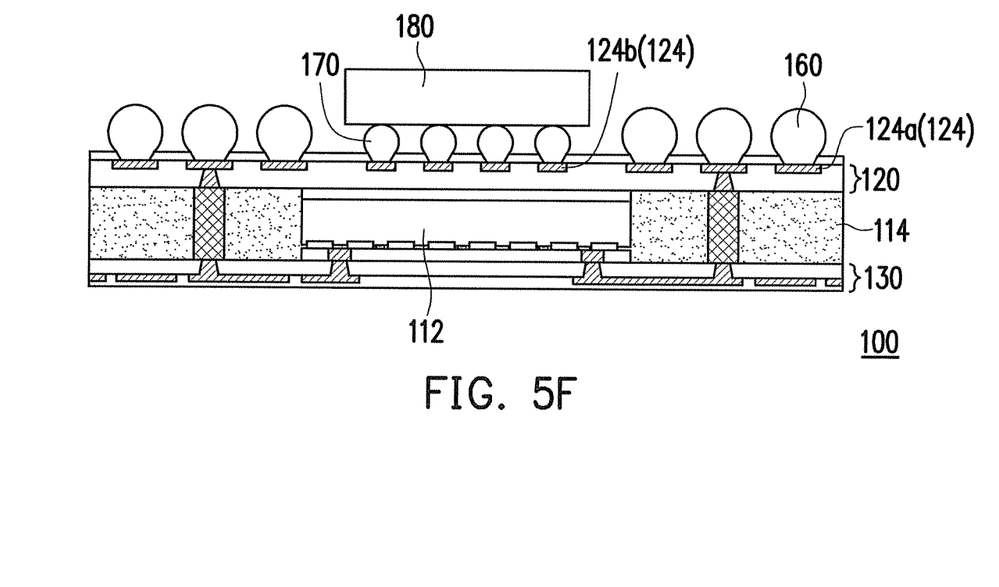

Referring to FIG. 5F and FIG. 6, in some embodiments, a plurality of electrical connectors 160, 170 are disposed on the contact pads 124a, 124b of the patterned metal layer 124 exposed by the openings. In some embodiments, a second die 180 is bonded on the top surface of the first redistribution layer 120 through the electrical connectors 170. In some embodiments, the electrical connectors 160 are electrically connected to the first redistribution layer 120, the second redistribution layer 130 and the first die 112. In some embodiments, the second die 180 is electrically connected to the first redistribution layer 120 and may be electrically connected to the first die 112. Then, the semiconductor package 100 is diced in subsequent processes and separated from the fixture 300. In some embodiments, the manufacturing process described above is part of a wafer level packaging process, a plurality of semiconductor packages 100 are obtained after the dicing process. In some embodiments, the fixture 300 is separated from the semiconductor packages 100 prior to dicing process.

According to some embodiments, a semiconductor package includes a molded semiconductor device, a first redistribution layer, a second redistribution layer and a plurality of through interlayer vias. The molded semiconductor device includes a first die. The first redistribution layer is disposed on a first side of the molded semiconductor device. The second redistribution layer is disposed on a second side of the molded semiconductor device opposite to the first side, wherein the second redistribution layer includes a patterned metal layer having an interconnection circuit portion electrically connected to the first die and a metal ring surrounding and insulated from the interconnection circuit portion. The through interlayer vias are located right under the metal ring and extends through the molded semiconductor device to be electrically connected to the first redistribution layer and the second redistribution layer.

According to some embodiments, a semiconductor package includes a first redistribution layer, at least one first die, a molding compound, a second redistribution layer, and a plurality of through interlayer vias. The first die is disposed on and electrically connected to the first redistribution layer. The molding compound is disposed on the first redistribution layer and at least encapsulates side surfaces of the first die. The second redistribution layer is disposed on the molding compound and the first die, and the second redistribution layer includes an interconnection circuit portion electrically connected to the first die and a metal ring surrounding and insulated from the interconnection circuit portion. The metal ring extends at the same level as the interconnection circuit portion. The through interlayer vias are located right under the metal ring and penetrate through the molding compound to be electrically connected to the first redistribution layer and the second redistribution layer. With the configuration, the space utilization can be enhance and the size of the semiconductor package 100 can be further reduced.

According to some embodiments, a manufacturing process for a semiconductor package includes the following steps. A carrier is provided. A first redistribution layer is formed on the carrier. A plurality of through interlayer vias are formed on the first redistribution layer, wherein the through interlayer vias are electrically connected to the first redistribution layer. At least one first die is disposed on the first redistribution layer. A molding compound encapsulating the first die and the through interlayer vias is formed. A second redistribution layer is formed on the molding compound and the first die. The formation of the second redistribution layer includes forming a patterned metal layer with an interconnection circuit portion electrically connected to the first die and a metal ring surrounding and insulated from the interconnection circuit portion. The carrier is debonded from the first redistribution layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
   a molded semiconductor device comprising a first die;
   a first redistribution layer, disposed on a first side of the molded semiconductor device;
   a second redistribution layer, disposed on a second side of the molded semiconductor device opposite to the first side, wherein the second redistribution layer comprises a patterned metal layer having an interconnection circuit portion electrically connected to the first die and a metal ring surrounding the interconnection circuit portion and separating from the interconnection circuit portion; and
   a plurality of through interlayer vias (TIVs), connected to a portion of the metal ring and located under the metal ring, the through interlayer vias extending through the molded semiconductor device to be electrically connected to the first redistribution layer and the second redistribution layer.

2. The semiconductor package as claimed in claim 1, wherein at least one of the through interlayer vias is electrically connected to the metal ring, and at least another one of the through interlayer vias is electrically connected to the interconnection circuit portion.

3. The semiconductor package as claimed in claim 1, wherein the metal ring is located at the same level as the interconnection circuit portion.

4. The semiconductor package as claimed in claim 1, wherein the metal ring is in a metal mesh form.

5. The semiconductor package as claimed in claim 1, wherein the interconnection circuit portion comprises a plurality of interconnection lines and a metal mesh pattern isolated from the interconnection lines.

6. The semiconductor package as claimed in claim 1, further comprising a seal ring disposed on the molded semiconductor device, wherein the seal ring surrounds the metal ring and is isolated from the metal ring.

7. The semiconductor package as claimed in claim 1, further comprising a second die disposed on and electrically connected to the first redistribution layer.

8. The semiconductor package as claimed in claim 1, wherein the first die is a sensor chip and the semiconductor package further comprises a protection layer covering the second redistribution layer.

9. A semiconductor package comprising:
   a first redistribution layer;
   at least one first die, disposed on and electrically connected to the first redistribution layer;
   a molding compound, disposed on the first redistribution layer and at least encapsulating side surfaces of the first die;
   a second redistribution layer, disposed on the molding compound and the first die, wherein the second redistribution layer comprises an interconnection circuit portion electrically connected to the first die and a metal ring surrounding and insulated from the interconnection circuit portion, and the metal ring is located at the same level as the interconnection circuit portion; and
   a plurality of through interlayer vias (TIVs), located between the metal ring and the first redistribution layer and penetrating through the molding compound to be electrically connected to the first redistribution layer and the second redistribution layer.

10. The semiconductor package as claimed in claim 9, wherein at least one of the through interlayer vias is electrically connected to the metal ring, and at least another one of the through interlayer vias is electrically connected to the interconnection circuit portion.

11. The semiconductor package as claimed in claim 9, wherein the metal ing is in a mesh form comprising a plurality of openings.

12. The semiconductor package as claimed in claim 9, wherein the interconnection circuit portion comprises a plurality of interconnection lines and a metal mesh pattern insulated from the interconnection lines.

13. The semiconductor package as claimed in claim 9, further comprising a seal ring disposed on the molding compound, wherein the seal ring surrounds the metal ring and is isolated from the metal ring.

14. The semiconductor package as claimed in claim 9, wherein the plurality of through interlayer vias is located below the metal ring and located within a span of the metal ring.

15. The semiconductor package as claimed in claim 9, wherein the first die comprises a fingerprint sensor and the semiconductor package further comprises a protection layer covering the second redistribution layer.

16. A manufacturing process for a semiconductor package, comprising:
   providing a carrier;
   forming a first redistribution layer on the carrier;
   forming through interlayer vias (TIVs) on the first redistribution layer, wherein the through interlayer vias are electrically connected to the first redistribution layer;
   disposing at least one first die on the first redistribution layer;
   forming a molding compound encapsulating the first die and the through interlayer vias;
   forming a second redistribution layer on the molding compound and the first die, wherein forming the second redistribution layer comprises forming a patterned metal layer with an interconnection circuit portion electrically connected to the first die and a metal ring surrounding and insulated from the interconnection circuit portion; and
   debonding the carrier from the first redistribution layer.

17. The manufacturing process for the semiconductor package as claimed in claim 16, wherein the step of forming the second redistribution layer on the molding compound and the first die comprises:
   forming a patterned first dielectric layer on the molding compound and the first die exposing the through interlayer vias and electrical terminals of the first die; and
   forming a patterned metal layer on the patterned first dielectric layer connected to the through interlayer vias and the electrical terminals of the first die, wherein forming the patterned metal layer comprises forming a gap to separate the interconnection circuit portion and the metal ring, and the interconnection circuit portion electrically connected to at least one of the through interlayer vias and the electrical terminals of the first die through the openings.

18. The manufacturing process for the semiconductor package as claimed in claim 16, further comprising:
   disposing a protection layer on the second redistribution layer.

19. The manufacturing process for the semiconductor package as claimed in claim 16, wherein forming the patterned metal layer further comprises:
   forming at least one first pad portion connected to the through interlayer via and connected to the metal ring to electrically connect the through interlayer via with the metal ring.

20. The manufacturing process for the semiconductor package as claimed in claim 19, wherein forming the patterned metal layer further comprises:
   forming at least one second pad portion connected to the through interlayer via and connected to the interconnection circuit portion to electrically connect the through interlayer via with the interconnection circuit portion.

\* \* \* \* \*